(12) United States Patent
Arita et al.

(10) Patent No.: US 6,403,422 B2
(45) Date of Patent: *Jun. 11, 2002

(54) SEMICONDUCTOR DEVICE AND METHOD OF MANUFACTURING THE SAME

(75) Inventors: Hidenori Arita; Kazuaki Miyata, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,567

(22) Filed: Nov. 23, 1998

(30) Foreign Application Priority Data

Jun. 15, 1998 (JP) .......................... 10-166873

(51) Int. Cl.[7] .......................... H01L 21/8236
(52) U.S. Cl. ...................... 438/278; 438/217; 438/276; 438/290
(58) Field of Search ................ 438/174, 175, 438/194, 217–219, 276, 278, 282, 289–291, 514, 526

(56) References Cited

U.S. PATENT DOCUMENTS

| | | | | |
|---|---|---|---|---|
| 4,356,042 A | * | 10/1982 | Gedaly et al. ............... | 438/278 |
| 5,091,328 A | * | 2/1992 | Miller ......................... | 438/278 |
| 5,219,776 A | | 6/1993 | Wada .......................... | 438/278 |
| 5,488,009 A | * | 1/1996 | Hsue et al. .................. | 438/278 |
| 5,514,609 A | * | 5/1996 | Chen et al. .................. | 438/278 |
| 5,538,906 A | * | 7/1996 | Aoki ........................... | 438/278 |

FOREIGN PATENT DOCUMENTS

| | | |
|---|---|---|
| JP | 04-087370 | 3/1992 |
| JP | 08-078539 | 3/1996 |

\* cited by examiner

*Primary Examiner*—Carl Whitehead, Jr.
*Assistant Examiner*—Jamie L. Brophy
(74) *Attorney, Agent, or Firm*—McDermott, Will & Emery

(57) ABSTRACT

The semiconductor device is provided with an element isolating region disposed in a matrix to define a channel region on a semiconductor substrate, gate interconnection layers extending in a direction and disposed at predetermined intervals from each other above element isolating region, and aluminum interconnection layers extending in a direction intersecting gate interconnection layers and disposed at predetermined intervals from each other, aluminum interconnection layer being disposed above element isolating region. Thus, it becomes possible to provide a semiconductor device and a method of manufacturing thereof which enable the reduction in time required for the final manufacturing steps of the semiconductor device after the ROM specifications are determined.

4 Claims, 11 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the device, and more specifically to the improvements in the pattern configuration of an ROM region of a semiconductor device incorporating an ROM (Read Only Memory) and to a method of manufacturing the device.

2. Description of the Background Art

In general, in manufacturing a semiconductor device incorporating an ROM formed using photolithography and ion-implantation techniques, the specifications of the ROM vary according to the needs of the customers. Consequently, since all semiconductor devices employ masks of identical specifications, during the manufacturing steps of the semiconductor device incorporating an ROM, the same manufacturing steps are adopted as far as the step preceding the forming step of an ROM region. As a result, the structures of the semiconductor devices at this unfinished stage are identical, and in this unfinished condition the semiconductor devices are stored for the time being.

Then, after the specifications of an ROM are determined based on the order placed by the customer, the manufacturing steps for the unfinished semiconductor device are resumed, an ROM region is patterned according to the ROM specifications, and the final manufacturing steps are carried out.

Referring now to FIG. 14, the planar pattern structure of an ROM region in the conventional semiconductor device will be described.

Element isolating regions 12 are disposed regularly at predetermined intervals in the X and Y directions, and gate interconnection layers 13 extending in the Y direction are disposed at predetermined intervals in the X direction.

Aluminum interconnection layers 10 extending in the X direction are disposed at predetermined intervals in the Y direction in regions between element isolating regions 12. A plurality of contact holes 9 are provided in aluminum interconnection layer 10 to provide electrical connection to active regions on a semiconductor substrate 1. A channel region 14 of an ROM transistor is formed on semiconductor substrate 1 where gate interconnection layer 13 and aluminum interconnection layer 10 intersect.

Referring now to FIGS. 15–19, the manufacturing steps of an ROM transistor formed in the ROM region having the above-mentioned structure will be described below.

Referring first to FIG. 15, element isolating region 12 as shown in FIG. 14 is formed in a matrix using the LOCOS (Local Oxidation of Silicon) method to define an active region in a given region on the surface of silicon semiconductor substrate 1.

Next, a silicon oxide film 2 having a thickness of 100 Å to 300 Å is formed by thermal oxidation on the surface of silicon semiconductor substrate 1. Thereafter, a polycrystalline silicon layer 3 having a film thickness of 1000 Å to 3000 Å is formed on oxide film 2 using the CVD (Chemical Vapor Deposition) method. Then, on polycrystalline silicon layer 3, a tungsten silicide layer 4 having a film thickness of 1000 Å to 3000 Å is formed by sputtering.

Thereafter, silicon oxide film 2, polycrystalline silicon layer 3, and tungsten silicide layer 4 are patterned using photolithography and etching techniques. Thus, gate interconnection layer 13 including oxide film 2, polycrystalline silicon layer 3, and tungsten silicide layer 4 is completed.

Next, referring to FIG. 16, using as a mask the gate interconnection layer 13 including oxide film 2, polycrystalline silicon layer 3, and tungsten silicide layer 4, an n-type impurity such as As is implanted with a dosage of $1\times10^{15}/cm^2$ to $1\times10^{16}/cm^2$ at an implantation energy of 30 keV to 60 keV into semiconductor substrate 1. Then, the impurity implanted into semiconductor substrate 1 is diffused thermally, and n+ type impurity diffusion regions 5 which later become source/drain regions of an ROM transistor is completed.

Referring now to FIG. 17, a resist film 7 of a predetermined pattern is formed selectively on n+ type impurity diffusion region 5. Thereafter, in order to determine the threshold voltage (Vth) of the ROM transistor, p-type impurity ions 8 such as boron are implanted into channel region 14 at an acceleration voltage, for example at approximately 200 keV, which penetrates oxide film 2, polycrystalline silicon layer 3, and tungsten silicide layer 4 to form channel implant 38.

Referring now to FIG. 18, resist film 7 is removed, and then, semiconductor substrate 1 is heat-treated to activate p-type impurity ions 8. Thereafter, an interlayer insulating film 6 having a thickness of 0.4 $\mu$m to 1.2 $\mu$m and being formed of TEOS (Tetra Ethyl Ortho Silicate) and/or BPSG (Boro Phospho Silicate Glass) is formed by the CVD method so as to cover tungsten silicide layer 4 and n+ type impurity diffusion region 5. Then, contact hole 9 reaching n+ type impurity diffusion region 5 is formed selectively in interlayer insulating film 6 by etching.

Referring now to FIG. 19, aluminum interconnection layer 10 having a film thickness of 0.6 $\mu$m to 1.0 $\mu$m is formed by sputtering, and thereafter, a surface protection film 11 such as a nitride film having a film thickness of 0.5$\mu$m to 1.0 $\mu$m is formed by the CVD method. From the above-described steps, the ROM transistor is formed with its threshold voltage (Vth) set at a predetermined level.

The patterned structure of the aforementioned conventional ROM transistor, however, is as shown in FIG. 14 in which aluminum interconnection layer 10 crosses channel region 14 where impurity ions are implanted to determine the threshold voltage (Vth) of the ROM transistor.

Thus, the manufacturing steps are interrupted after forming n+ type impurity diffusion regions 5 which later become the source/drain regions of the ROM transistor shown in FIG. 16, and the final manufacturing steps shown in FIGS. 17–19 are performed after the ROM specifications are determined based on the order placed by the customer.

As a result, due to the long manufacturing period required for the final manufacturing steps shown in FIGS. 17–19 after the ROM specifications are determined, it has been a problem that too much time was required from the time of order to the time when the products are supplied to the customer.

SUMMARY OF THE INVENTION

An object of the present invention is to provide a semiconductor device and a method of manufacturing the device which shortens the manufacturing period required for the final manufacturing steps of a semiconductor device after the ROM specifications are determined.

A semiconductor device according to the present invention is provided with an element isolating region disposed in a matrix for defining an active region on a semiconductor substrate, first conductive layers extending in a direction and disposed at predetermined intervals from each other above the element isolating region, and second conductive layers extending in a direction intersecting the first conductive layers and disposed at predetermined intervals from each other above the first conductive layers. The second conductive layer, also, is disposed above the element isolating region.

Moreover, preferably in the above-mentioned semiconductor device, the active region forms source/drain regions and a channel region, the first conductive layer forms a gate interconnection layer, the second conductive layer forms an aluminum interconnection layer, and the source/drain regions, the channel region, the gate interconnection layer, and the aluminum interconnection layer together form an ROM transistor.

In accordance with one aspect of the method of manufacturing a semiconductor device according to the present invention, the method includes the steps of forming an element isolating region in a matrix to define an active region on a semiconductor substrate, forming a first conductive layer at a given location of the active region defined by the element isolating region with an insulating film therebetween, introducing a first impurity into the semiconductor substrate using the first conductive layer as a mask to form an impurity diffusion region, covering the impurity diffusion region and the first conductive layer to form an interlayer insulating film having a contact hole reaching to the impurity diffusion region, forming on the interlayer insulating film a second conductive layer extending above the element isolating region and connecting electrically to the impurity diffusion region at a contact hole, forming a surface protection layer covering the interlayer insulating film and the second conductive layer, forming on the surface protection layer a resist film leaving exposed a region corresponding to the active region below the first conductive layer, and introducing a second impurity into the active region using the resist film as a mask to adjust the concentration of impurity in the active region below the first conductive layer.

In the above-mentioned semiconductor device and the method of manufacturing the device, the second conductive layer is formed extending above the element isolating region. Therefore, only the first conductive layer, the interlayer insulating film, and the surface protection layer exist above the active region which forms a channel region. Consequently, it is possible to adjust the concentration of the impurity in the active region below the first conductive layer after the surface protection layer is formed.

In the aforementioned semiconductor device, the insulating film is preferably a silicon oxide film having a thickness of 100 Å to 300 Å formed by thermal oxidation. The first conductive layer has a film thickness of 2000 Å to 6000 Å and has a two-layered structure including a polycrystalline silicon layer formed by the CVD method and a tungsten silicide layer formed by sputtering. The interlayer insulating film has a thickness of 0.4 μm to 1.2 μm, is made of at least one of TEOS and BPSG, and is formed by the CVD method. The surface protection layer is a nitride film with a thickness of 0.5 μm to 1.0 μm. The second impurity is introduced at an acceleration voltage of 1000 keV to 2000 keV.

Thus, the introduction of the second impurity into the active region is ensured using the resist film as a mask.

Next, in accordance with another aspect of the method of manufacturing a semiconductor device according to the present invention, the method includes the steps of forming an element isolating region in a matrix to define an active region on a semiconductor substrate, forming a first conductive layer at a given location of the active region defined by the element isolating region with an insulating film therebetween, introducing a first impurity into the semiconductor substrate using the first conductive layer as a mask to form an impurity diffusion region, covering the impurity diffusion region and the first conductive layer to form an interlayer insulating film having a contact hole leading to the impurity diffusion region, forming a resist film covering the contact hole and leaving exposed a region corresponding to the active region below the first conductive layer, introducing a second impurity into the active region using the resist film as a mask to adjust the concentration of impurity in the active region below the first conductive layer, removing the resist film and thereafter forming on the interlayer insulating film a second conductive layer connecting electrically to the impurity diffusion region at a contact hole, and forming a surface protection layer covering the second conductive layer.

According to the method of manufacturing the semiconductor device described above, the concentration of the impurity in the active region below the first conductive layer can be adjusted after the interlayer insulating film is formed.

In the aforementioned semiconductor device, the insulating film is preferably a silicon oxide film having a thickness of 100 Å to 300 Å formed by thermal oxidation. The first conductive layer has a film thickness of 2000 Å to 6000 Å and has a two-layered structure including a polycrystalline silicon layer formed by the CVD method and a tungsten silicide layer formed by sputtering. The interlayer insulating film has a film thickness of 0.4 μm to 1.2 μm, is made of at least one of TEOS and BPSG, and is formed by the CVD method. The second impurity is introduced at an acceleration voltage of 400 keV to 1000 keV.

Thus, the introduction of the second impurity into the active region is ensured using the resist film as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
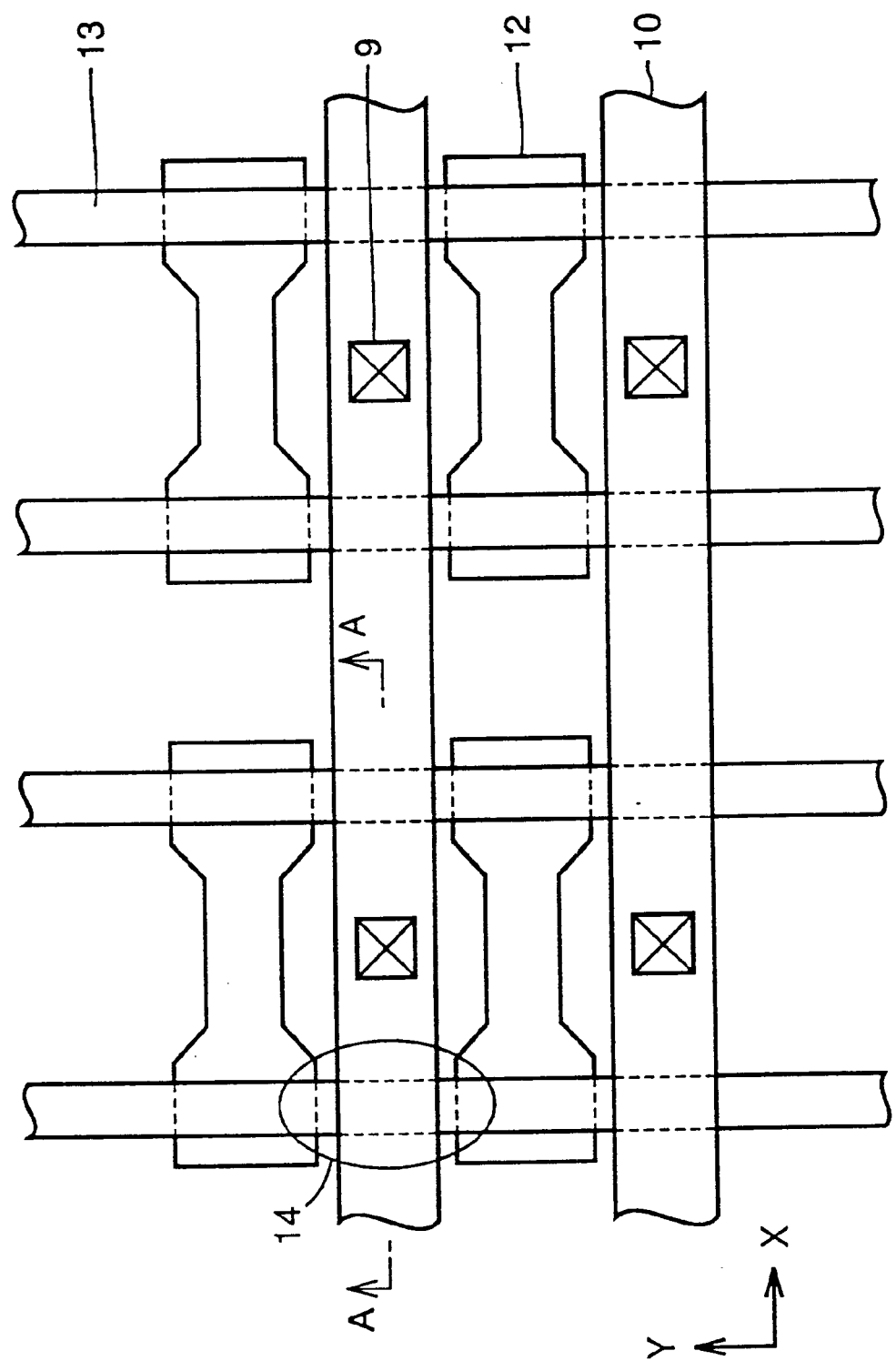
FIG. 1 is a plan view of the ROM region of the semiconductor device according to the first embodiment of the present invention.

The semiconductor device in accordance with the embodiments of the present invention and the method of manufacturing the device will be described below with reference to the drawings.

First Embodiment

The semiconductor device and the method of manufacturing the device according to this embodiment will be described with reference to FIGS. 1–7.

First, referring to FIG. 1, the planar pattern structure of an ROM region of a semiconductor device will be described. Element isolating regions 12 formed of an oxide film or the like are disposed regularly at predetermined intervals in the X and Y directions. Gate interconnection layers 13 serving as first interconnection layers extending in the Y direction at a line width of 0.5 μm to 1.5 μm are disposed at predetermined intervals in the X direction.

In regions between element isolating regions 12, aluminum interconnection layers 10 serving as second interconnection layers extending in the X direction at a line width of 0.8 μm to 2.0 μm are disposed at predetermined intervals in the Y direction. A plurality of contact holes 9 are provided at given locations in aluminum interconnection layer 10 to establish electrical connection with active regions on semiconductor substrate 1.

Channel region 14 of an ROM transistor formed of an active region is formed on semiconductor substrate 1 where gate interconnection layer 13 and aluminum interconnection layer 10 intersect.

Figure 2:
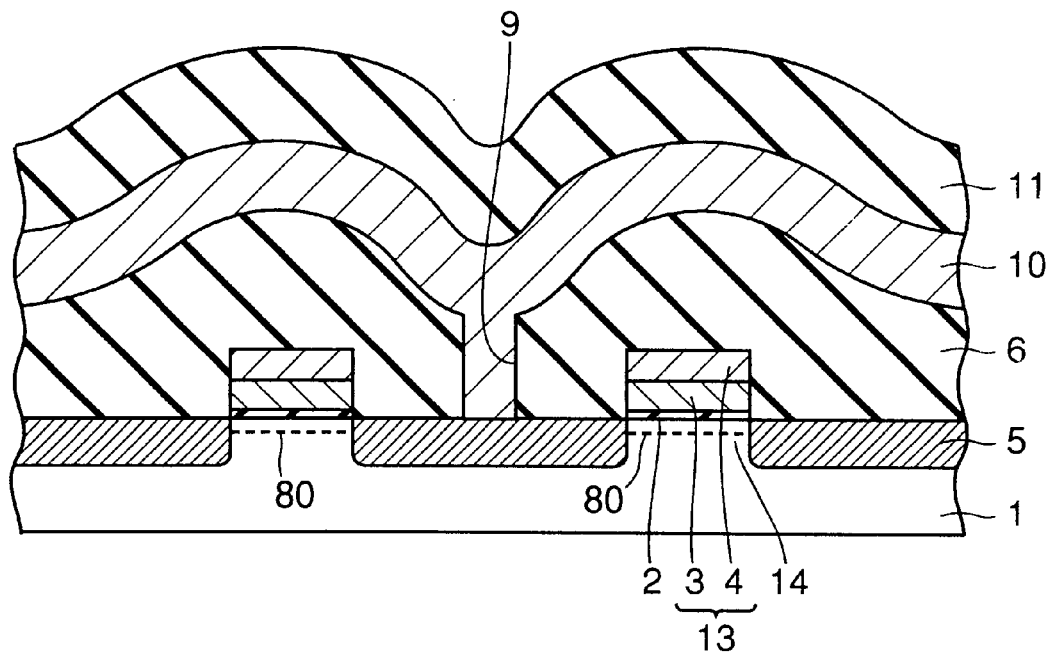
FIG. 2 is a cross sectional view taken along the line A—A in FIG. 1.

Referring now to FIG. 2, the cross sectional structure taken along the line A—A in FIG. 1 is described below. Gate interconnection layer 13 having a predetermined shape and including oxide film 2, polycrystalline silicon layer 3, and tungsten silicide layer 4 is formed on semiconductor substrate 1.

From the surface down to a predetermined depth of semiconductor substrate 1, n+ type impurity diffusion regions 5 are formed with gate interconnection layer 13 in between. Channel region 14 is formed in a region between n+ type impurity diffusion regions 5 below gate interconnection layer 13 with p-type channel implant 80. Gate interconnection layer 13, a pair of n+ type impurity diffusion regions 5, and channel region 14 together form an ROM transistor.

Interlayer insulating film 6 is formed so as to cover gate interconnection layer 13 and n+ type impurity diffusion region 5. Contact hole 9 reaching n+ type impurity diffusion region 5 is provided in the interlayer insulating film 6.

Owing to this contact hole 9, aluminum interconnection layer 10 and n+ type impurity diffusion region 5 are connected electrically. Further, surface protection film 11 is formed on aluminum interconnection layer 10.

Next, the manufacturing steps of an ROM transistor formed in the ROM region having the aforementioned structure will be described with reference to FIGS. 3–7.

Figure 3:
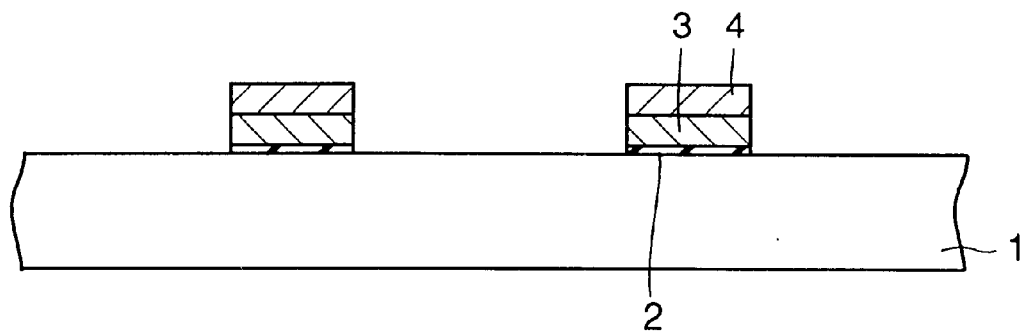
FIGS. 3–7 are cross sectional views representing the first to fifth steps of the method of manufacturing the semiconductor device in accordance with the first embodiment of the invention.

Referring first to FIG. 3, element isolating region 12 as shown in FIG. 1 is formed in a matrix using the LOCOS method to define an active region in a given region on the surface of silicon semiconductor substrate 1.

Next, an oxide film 2 having a thickness of 100 Å to 300 Å is formed by thermal oxidation on the surface of silicon semiconductor substrate 1. Thereafter, a polycrystalline silicon layer 3 having a film thickness of 1000 Å to 3000 Å is formed on oxide film 2 using the CVD method. Then, on polycrystalline silicon layer 3, a tungsten silicide layer 4 having a film thickness of 1000 Å to 3000Å is formed by sputtering.

Thereafter, oxide film 2, polycrystalline silicon layer 3, and tungsten silicide layer 4 are patterned using photolithography and etching techniques. Thus, gate interconnection layer 13 including oxide film 2, polycrystalline silicon layer 3, and tungsten silicide layer 4 is completed.

Figure 4:
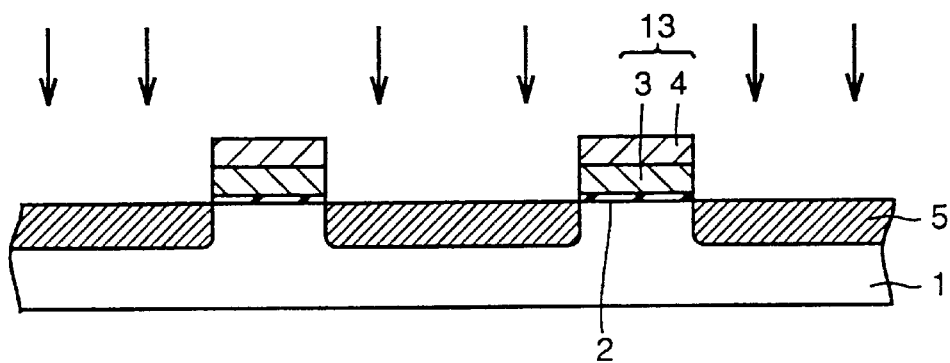

Next, referring to FIG. 4, using gate interconnection layer 13 as a mask, an n-type impurity such as As is implanted with a dosage of $1 \times 10^{15}/cm^2$ to $1 \times 10^{16}/cm^2$ at an implantation energy of 30 keV to 60 keV into semiconductor substrate 1. Then, the impurity implanted into semiconductor substrate 1 is diffused thermally, and n+ type impurity diffusion regions 5 which later become source/drain regions of an ROM transistor is completed.

Figure 5:
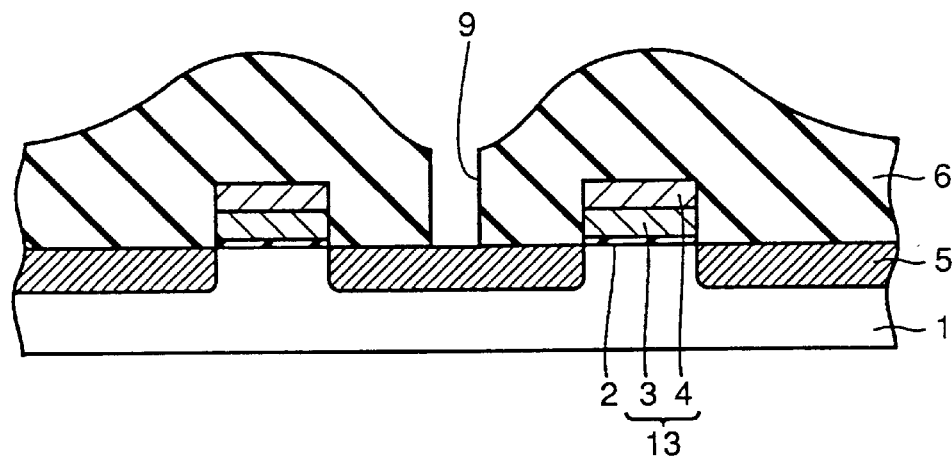

Referring now to FIG. 5, an interlayer insulating film 6 having a thickness of 0.4 μm to 1.2 μm and being formed of TEOS and/or BPSG is formed by the CVD method so as to cover gate interconnection layer 13 and n+ type impurity diffusion region 5. Then, contact hole 9 reaching n+ type impurity diffusion region 5 is formed selectively in interlayer insulating film 6 by etching.

Figure 6:
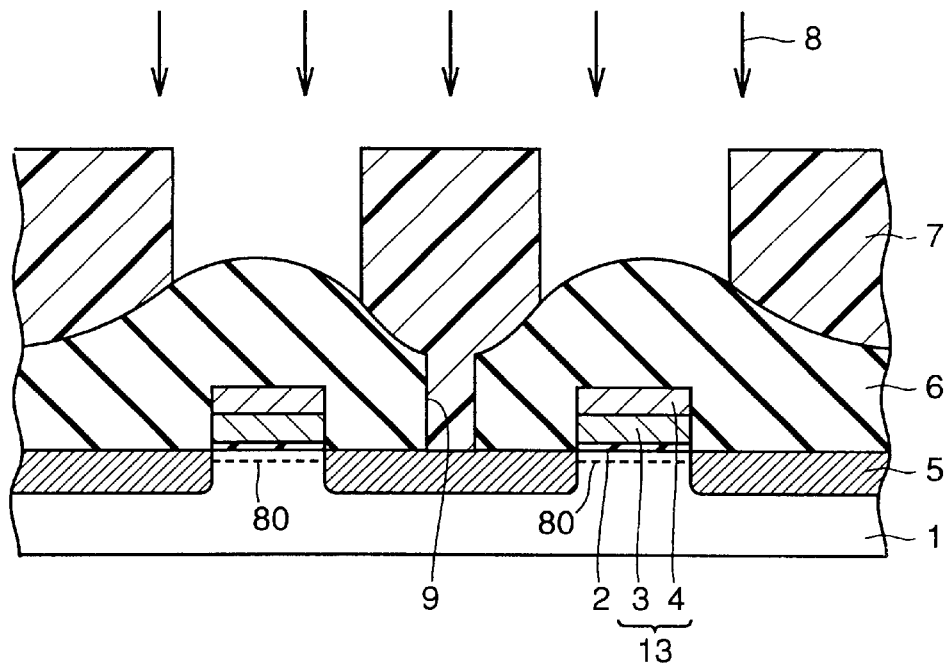

Referring now to FIG. 6, resist film 7 having a thickness of approximately 3.5 μm is formed covering a predetermined region on the surface of interlayer insulating film 6 and contact hole 9. Thereafter, in order to determine the threshold voltage (Vth) of the ROM transistor, p-type impurity ions 8 such as boron are implanted into channel region 14 at an acceleration voltage, for example at 400 keV to 1000 keV, which penetrates oxide film 2, polycrystalline silicon layer 3, and tungsten silicide layer 4 but not resist film 7.

Figure 7:
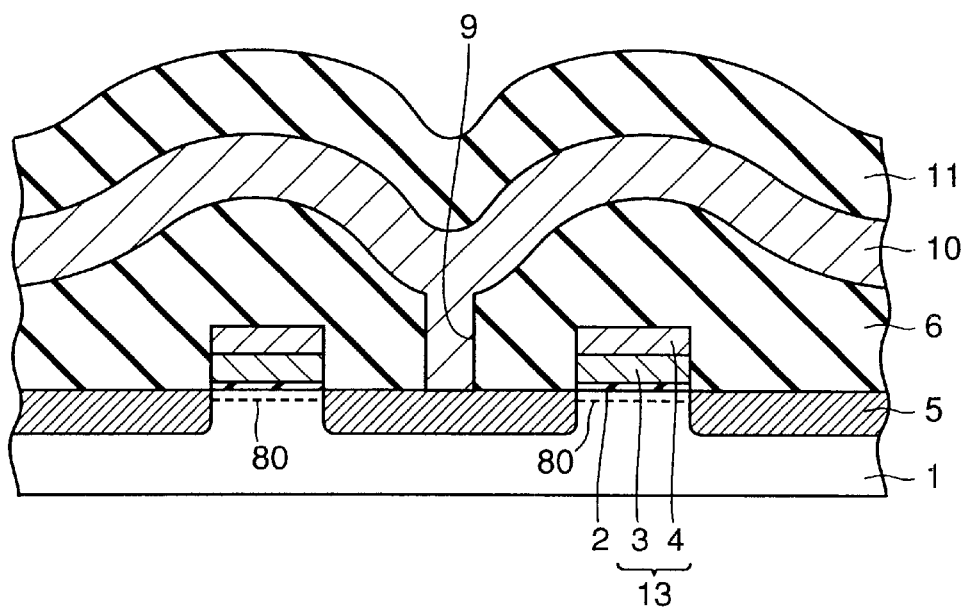

Referring now to FIG. 7, resist film 7 is removed, and then, semiconductor substrate 1 is heat-treated to activate p-type impurity ions 8. Thereafter, aluminum interconnection layer 10 having a film thickness of 0.6 μm to 1.0 μm is formed by sputtering, and thereafter, a surface protection film 11 such as a nitride film having a thickness of 0.5 μm to 1.0 μm is formed by the CVD method.

From the above-described steps, the ROM transistor is formed with its threshold voltage (Vth) set at a predetermined level.

With the method of manufacturing an ROM transistor in accordance with the above-described embodiment, it becomes possible to shorten the time required between the time when the order from the customer is received and the time when the products are supplied to the customer, since the impurity implantation step to set the threshold voltage (Vth) of the ROM transistor is performed after contact hole 9 is formed in interlayer insulating film 6 without modifying the planar pattern structure of a conventional ROM transistor.

Second Embodiment

The semiconductor device and the method of manufacturing the device according to this embodiment will be described with reference to FIGS. 8–13.

First, referring to FIG. 8, the planar pattern structure of an ROM region of a semiconductor device will be described. Element isolating regions 12 are disposed regularly at predetermined intervals in the X and Y directions. Gate interconnection layers 13 extending in the X direction at a line width of 0.5 μm to 1.5 μm are disposed at predetermined intervals in the Y direction.

Aluminum interconnection layers 10 extending in the Y direction at a line width of 0.8 μm to 2.0 μm are disposed at predetermined intervals in the X direction above element isolating regions 12. In regions between element isolating regions 12, a plurality of contact holes 9 are provided at given locations in aluminum interconnection layer 10 to establish electrical connection with active regions on semiconductor substrate 1.

Channel region 14 of an ROM transistor is formed on semiconductor substrate 1 where gate interconnection layer 13 and aluminum interconnection layer 10 intersect.

Figure 8:
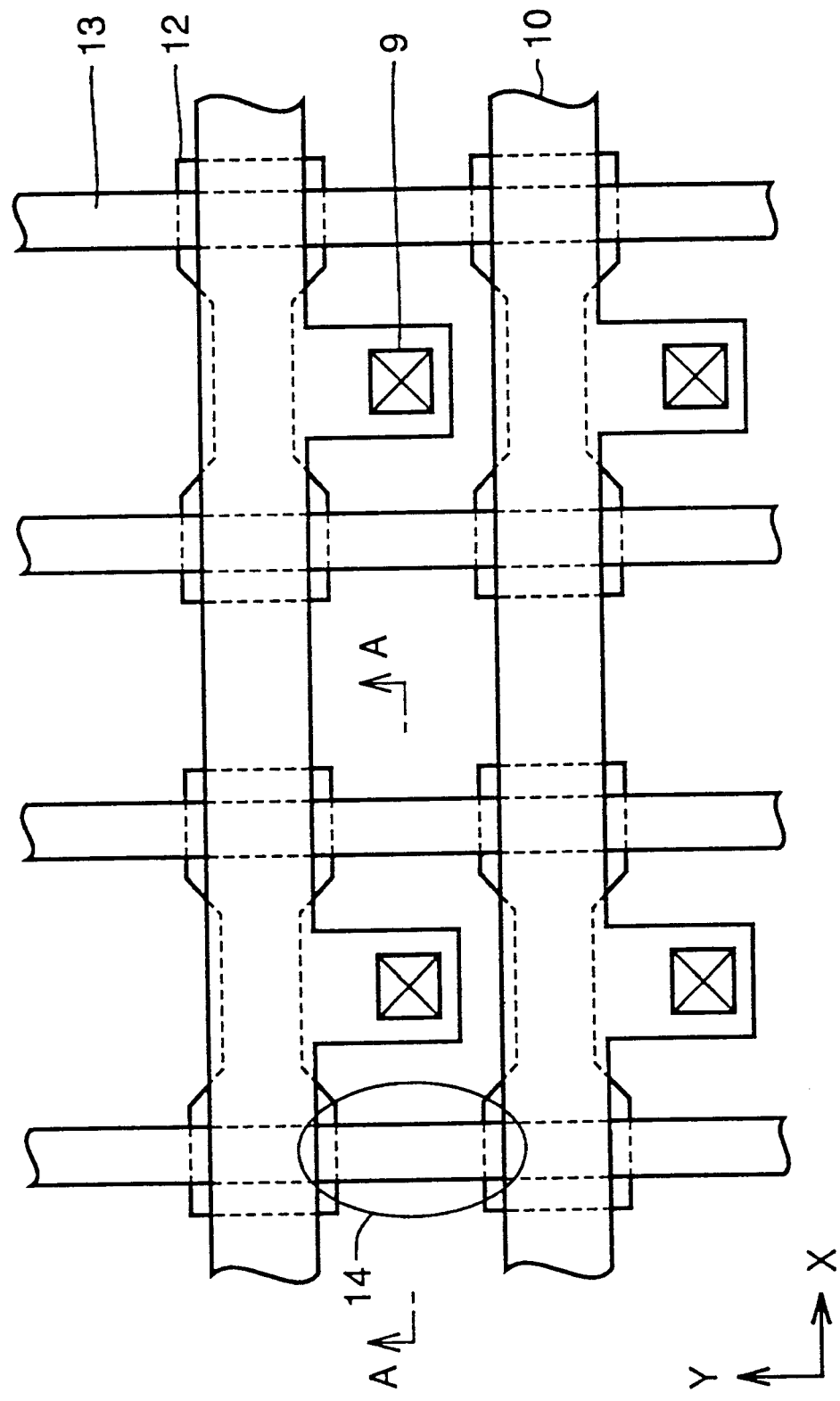
FIG. 8 is a plan view of the ROM region of the semiconductor device in accordance with the second embodiment of the invention.
Figure 9:
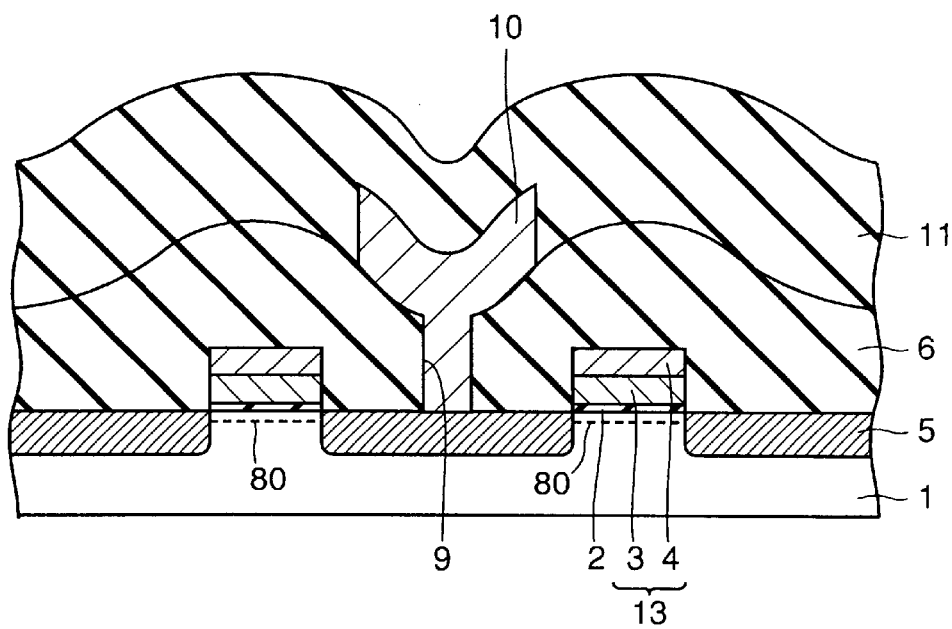
FIG. 9 is a cross sectional view taken along the line A—A in FIG. 8.

Referring now to FIG. 9, the cross sectional structure taken along the line A—A in FIG. 8 is described below. Gate interconnection layer 13 having a predetermined shape and including oxide film 2, polycrystalline silicon layer 3, and tungsten silicide layer 4 is formed on semiconductor substrate 1.

From the surface down to a predetermined depth of semiconductor substrate 1, n+ type impurity diffusion regions 5 are formed with gate interconnection layer 13 in between. Channel region 14 is formed in a region between n+ type impurity diffusion regions 5 below gate interconnection layer 13 with p-type channel implant 80. Gate interconnection layer 13, a pair of n+ type impurity diffusion regions 5, and channel region 14 together form an ROM transistor.

Interlayer insulating film 6 is formed so as to cover gate interconnection layer 13 and n+ type impurity diffusion region 5. Contact hole 9 reaching n+ type impurity diffusion region 5 is provided in the interlayer insulating film 6.

Owing to this contact hole 9, aluminum interconnection layer 10 and n+ type impurity diffusion region 5 are connected electrically. Further, surface protection film 11 is formed on aluminum interconnection layer 10 and interlayer insulating film 6.

Next, the manufacturing steps of an ROM transistor formed in the ROM region having the aforementioned structure will be described with reference to FIGS. 10–13. Further, the step of forming gate interconnection layer 13 including oxide film 2, polycrystalline silicon layer 3, and tungsten silicide layer 4 and the step of forming n+ type impurity diffusion region 5, interlayer insulating film 6, and contact hole 9, being the same as the steps of FIG. 3–5 illustrated in relation to the first embodiment, will not be repeated here.

Figure 10:
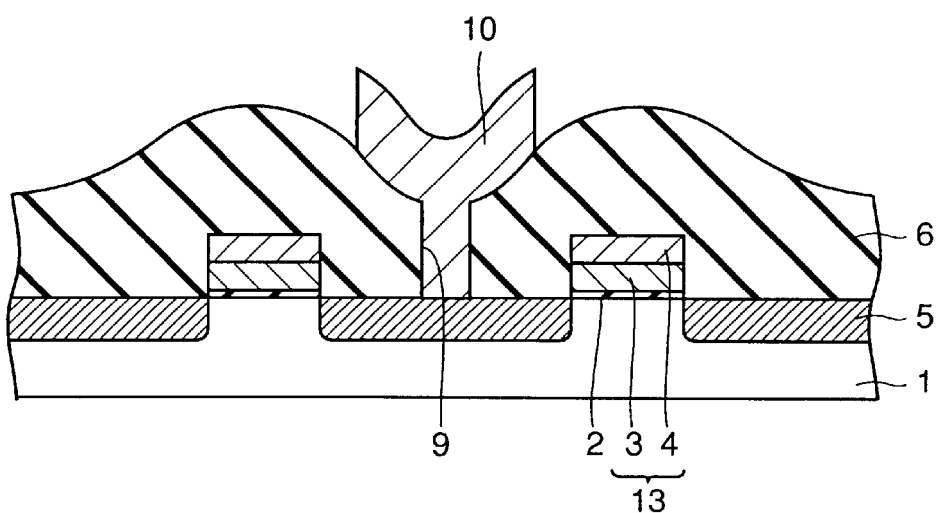
FIGS. 10–13 are cross sectional views representing the first to fourth steps of the method of manufacturing the semiconductor device in accordance with the second embodiment of the invention.

Referring to FIG. 10, aluminum interconnection layer 10 having a film thickness of 0.6 μm to 1.0 μm is formed by sputtering to provide electrical connection to n+ type impurity diffusion region 5 at contact hole 9. At this time, aluminum interconnection layer 10 is formed only above n+ type impurity diffusion region 5 and patterned so as not to cover channel region 14.

Figure 11:
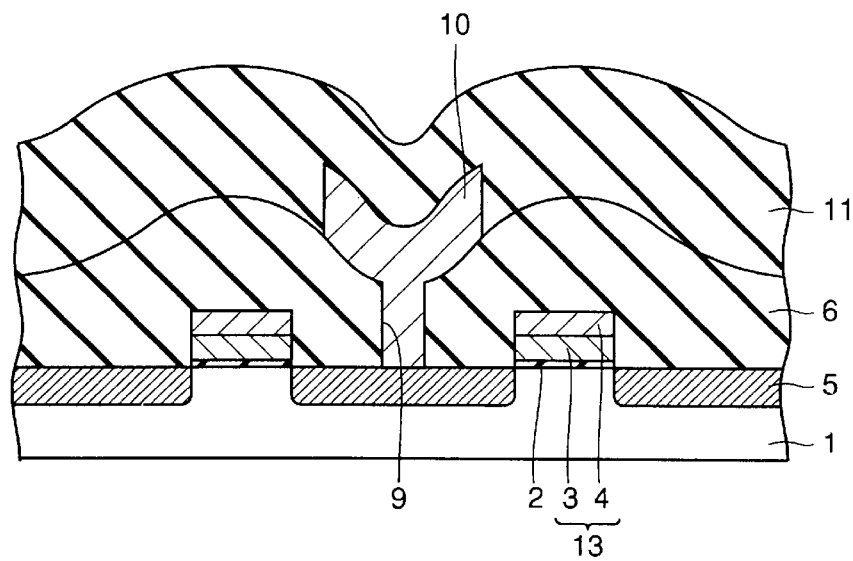

Referring now to FIG. 11, surface protection film 11 such as a nitride film having a thickness of 0.5 μm to 1.0 μm is formed by the CVD method to cover interlayer insulating film 6 and aluminum interconnection layer 10.

Figure 12:
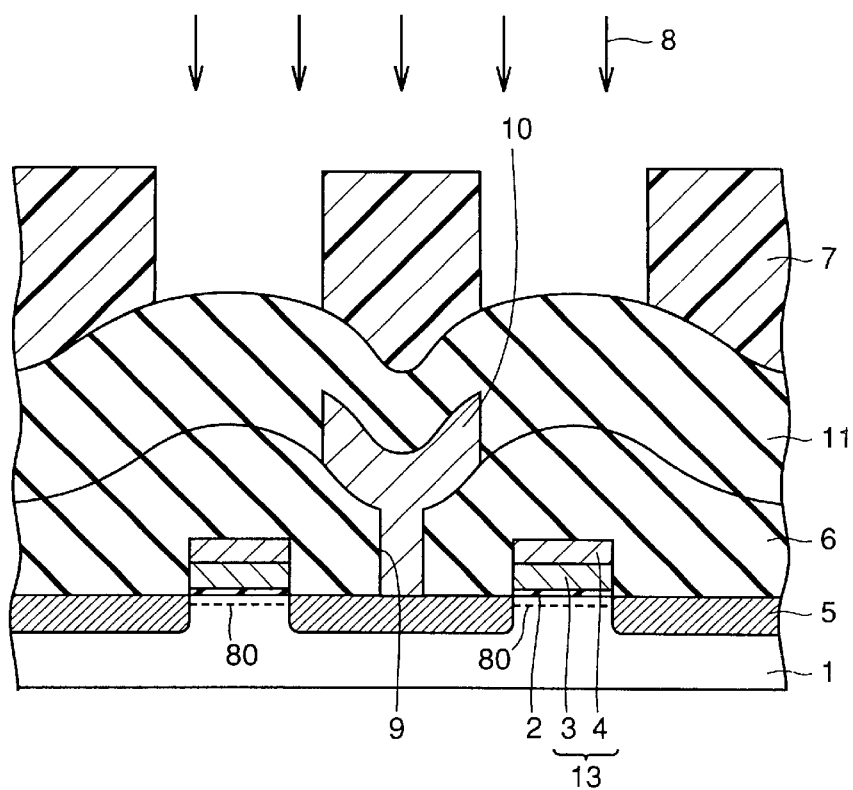

Referring now to FIG. 12, resist film 7 having a thickness of approximately 3.5 μm to 5.0 μm is formed in a predetermined region on the surface of surface protection film 11. Thereafter, in order to determine the threshold voltage (Vth) of the ROM transistor, p-type impurity ions 8 such as boron are implanted into channel region 14 at an acceleration voltage, for example at 1000 keV to 2000 keV, which penetrates surface protection film 11, interlayer insulating film 6, tungsten silicide layer 4, polycrystalline silicon layer 3, and oxide film 2 but not resist film 7.

Figure 13:
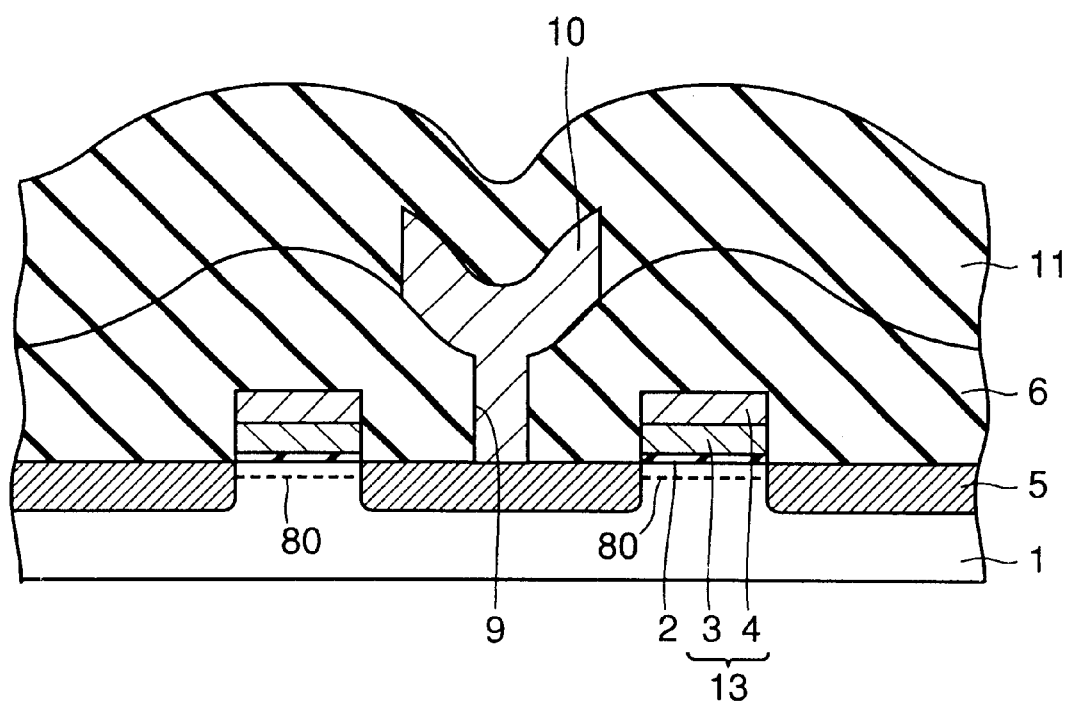
Figure 14:
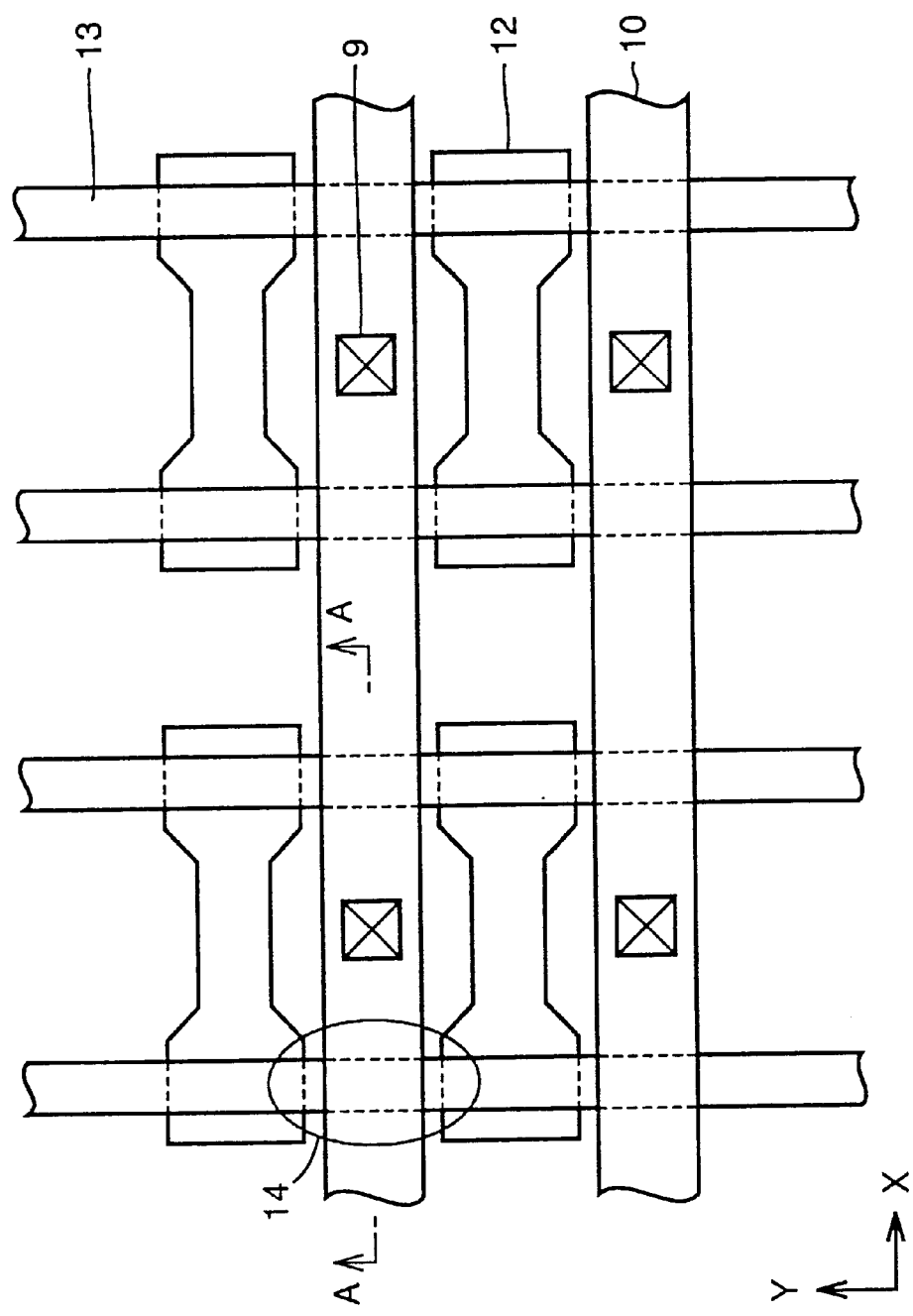
FIG. 14 is a plan view of the ROM region of the conventional semiconductor device.
Figure 15:
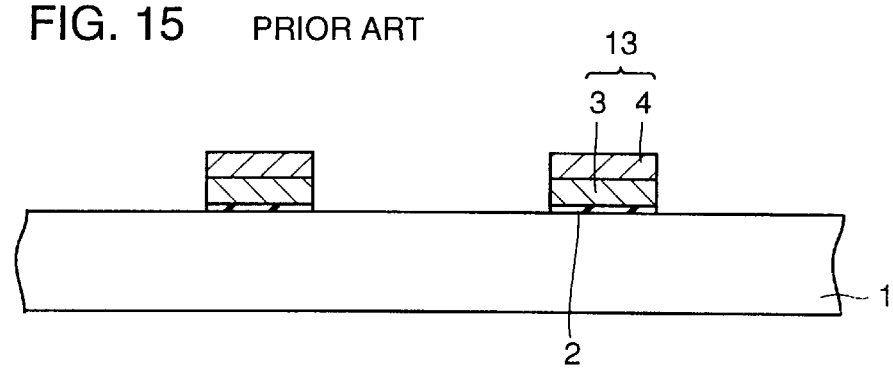
FIGS. 15–19 are cross sectional views representing the first to fifth steps of the method of manufacturing a conventional semiconductor device.
Figure 16:
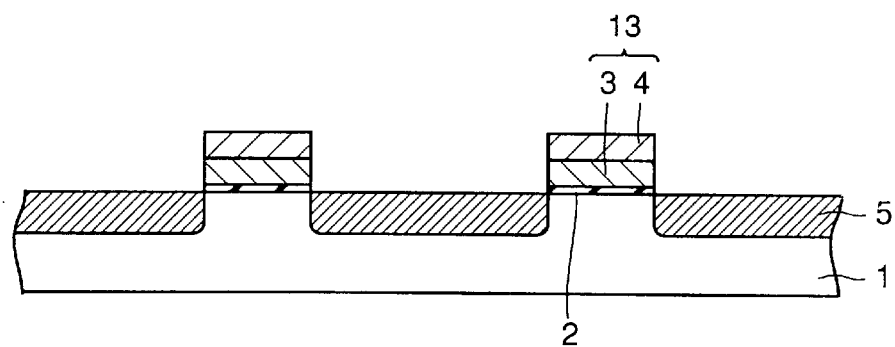
Figure 17:
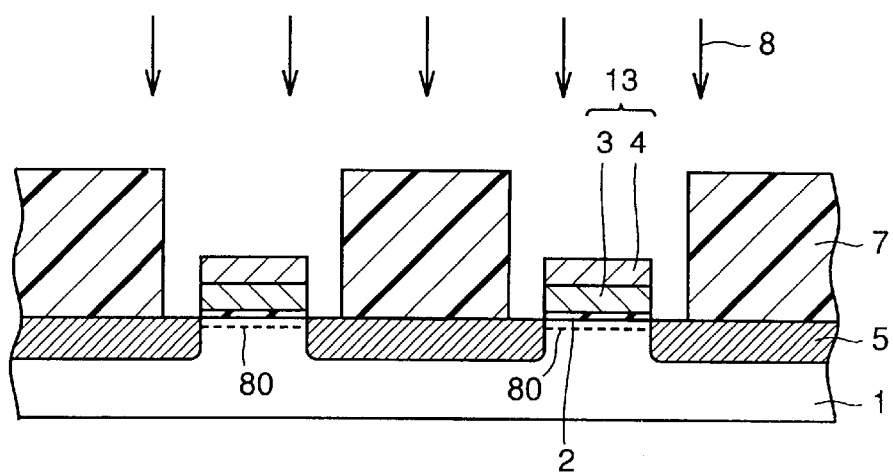
Figure 18:
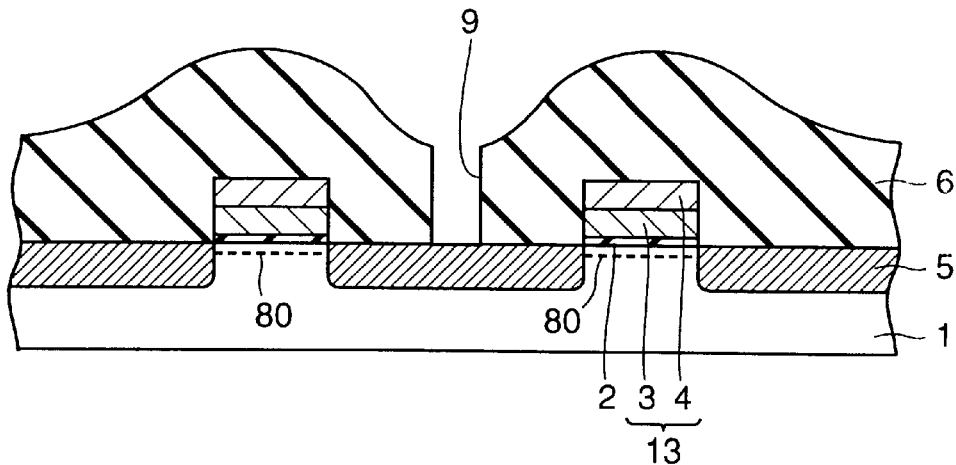
Figure 19:
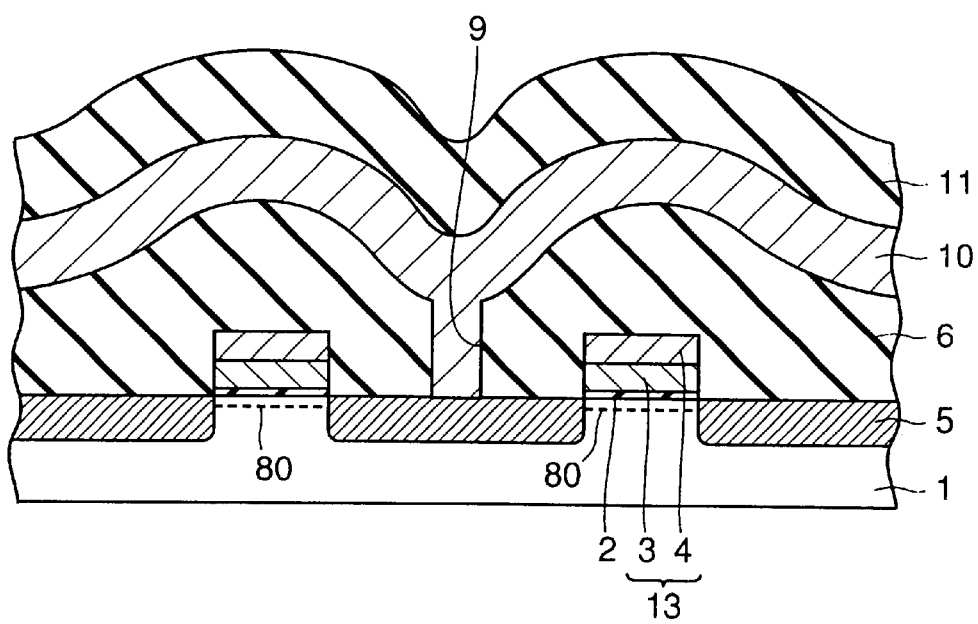

Thereafter, as in FIG. 13, resist film 7 is removed, and in order to activate p-type impurity ions 8, aluminum interconnection layer 10 is heat-treated at a temperature high enough yet not as high as to cause the melting of aluminum interconnection layer 10.

From the above-described steps, an ROM transistor set at a predetermined threshold voltage (Vth) is formed.

In the ROM transistor structure and the method of manufacturing thereof according to the aforementioned embodiment, since aluminum interconnection layer 10 is disposed above the element isolating region, aluminum interconnection layer does not run through above channel region 14 of the ROM transistor. As a result, the impurity implantation step for setting the threshold voltage (Vth) for the ROM transistor may be performed after surface protection film 11 is formed. Thus, a significant reduction in time required from the time of order by the customer to the time of supplying the products to the customer becomes possible.

Further, in each of the above-mentioned embodiments, the described ion implantation method to determine the threshold voltage (Vth) of an ROM transistor is the so-called channel-cut method where the threshold voltage (Vth) is raised by the implantation of p-type impurity ions 8 into channel region 14. The same effect, however, may be achieved using the so-called depletion method where the threshold voltage (Vth) is lowered by n-type impurity ion implantation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming an element isolating region in a matrix to define an active region on a semiconductor substrate;

forming a first conductive layer at a given location of said active region defined by said element isolating region with an insulating film therebetween;

introducing a first impurity into said semiconductor substrate using said first conductive layer as a mask to form an impurity diffusion region;

covering said impurity diffusion region and said first conductive layer to form an interlayer insulating film having a contact hole reaching said impurity diffusion region;

forming a resist film covering said contact hole and leaving exposed a region corresponding to said active region below said first conductive layer, wherein an opening corresponding to the active region is provided only to the resist film and not to the interlayer insulating film located beneath the resist film in the step of forming the resist film;

introducing a second impurity into said active region using said resist film as a mask to adjust impurity concentration in said active region below said first conductive layer;

removing said resist film and thereafter forming on said interlayer insulating film a second conductive layer connecting electrically to said impurity diffusion region at the contact hole; and forming a surface protection layer to cover said second conductive layer, wherein:

said impurity diffusion region includes a source region and a drain region; said contact hole is provided only in the drain region; and said second conductive layer is electrically connected to the drain region via said contact hole.

2. The method of manufacturing a semiconductor device according to claim 1, wherein said insulating film is a silicon oxide film having a thickness of 100 Å to 300 Å formed by thermal oxidation, said first conductive layer having a film thickness of 2000 Å to 6000 Å and having a two-layered structure including a polycrystalline silicon layer formed by the CVD method and a tungsten silicide layer formed by sputtering, said interlayer insulating film having a thickness of 0.4 μm to 1.2 μm, being made of at least one of TEOS and BPSG, and being formed by the CVD method, said second impurity being introduced at an acceleration voltage of 400 keV to 1000 keV.

3. A method of manufacturing a semiconductor device comprising the steps of:

forming an element isolating region in a matrix to define an active region on a semiconductor substrate;

forming a first conductive layer at a given location of said active region defined by said element isolating region with an insulating film therebetween;

introducing a first impurity into said semiconductor substrate using said first conductive layer as a mask to form an impurity diffusion region;

covering said impurity diffusion region and said first conductive layer to form an interlayer insulating film having a contact hole reaching said impurity diffusion region;

forming on said interlayer insulating film a second conductive layer extending above said element isolating region and connecting electrically to said impurity diffusion region at the contact hole;

forming a surface protection layer covering said interlayer insulating film and said second conductive layer;

forming on said surface protection layer a resist film leaving exposed a region corresponding to said active region below said first conductive layer, wherein an opening corresponding to the active region is provided only to the resist film and not to the surface protection layer located beneath the resist film in the step of forming the resist film; and ion implanting a second impurity into said active region using said resist film as a mask to adjust impurity concentration in said active region below a first conductive layer.

4. The method of manufacturing a semiconductor device according to claim 3, wherein said insulating film is a silicon oxide film having a thickness of 100 Å to 300 Å formed by thermal oxidation, said first conductive layer having a film thickness of 2000 Å to 6000 Å and having a two-layered structure including a polycrystalline silicon layer formed by the CVD method and a tungsten silicide layer formed by sputtering, said interlayer insulating film having a film thickness of 0.4 μm to 1.2 μm, being made of at least one of TEOS and BPSG, and being formed by the CVD method, said surface protection layer being a nitride film with a thickness of 0.5 μm to 1.0 μm, said second impurity being introduced at an acceleration voltage of 1000 keV to 2000 keV.

* * * * *

UNITED STATES PATENT AND TRADEMARK OFFICE
CERTIFICATE OF CORRECTION

PATENT NO.   : 6,403,422 B2
DATED        : June 11, 2002
INVENTOR(S)  : Hidenori Arita et al.

It is certified that error appears in the above-identified patent and that said Letters Patent is hereby corrected as shown below:

<u>Title page,</u>
Item [54], the title should read as -- METHOD OF MANUFACTURING A ROM DEVICE THAT INCLUDES ION IMPLANTATION THROUGH AN INSULATING LAYER --.

Signed and Sealed this

Twenty-sixth Day of November, 2002

Attest:

*Attesting Officer*

JAMES E. ROGAN
*Director of the United States Patent and Trademark Office*